United States Patent
Jau et al.

(10) Patent No.: US 10,013,040 B2
(45) Date of Patent: *Jul. 3, 2018

(54) RACK SERVER SYSTEM AND CONTROL METHOD THEREOF

(71) Applicant: Quanta Computer Inc., Taoyuan (TW)

(72) Inventors: Maw-Zan Jau, Taoyuan (TW); Tzu-Hung Wang, Taoyuan (TW); Chin-Hsiang Chan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 2 days.

This patent is subject to a terminal disclaimer.

(21) Appl. No.: 14/918,126

(22) Filed: Oct. 20, 2015

(65) Prior Publication Data
US 2016/0103183 A1 Apr. 14, 2016

Related U.S. Application Data (63) Continuation of application No. 13/409,256, filed on Mar. 1, 2012, now Pat. No. 9,360,911.

(30) Foreign Application Priority Data

Jul. 28, 2011 (TW) .............................. 100126882 A (51) Int. Cl.
| | |
|---|---|
| *G01R 31/36* | (2006.01) |
| *G06F 1/30* | (2006.01) |
| *G06F 11/24* | (2006.01) |
| *G06F 11/00* | (2006.01) |
| *G06F 11/20* | (2006.01) |

(52) U.S. Cl.
CPC ............ *G06F 1/30* (2013.01); *G01R 31/3627* (2013.01); *G06F 11/24* (2013.01); *G06F 11/006* (2013.01); *G06F 11/2015* (2013.01)

(58) Field of Classification Search
CPC ............ H01M 10/482; H01M 10/441; H01M 10/4207; H02J 7/0021; H02J 9/062; H02J 9/061; Y02T 10/7005; B60L 11/1864
USPC ............ 320/116, 118, 119, 134, 126; 702/63
See application file for complete search history.

(56) References Cited

U.S. PATENT DOCUMENTS

| | | | | |
|---|---|---|---|---|
| 6,583,603 | B1 * | 6/2003 | Baldwin ............ | G01R 31/3648 320/121 |
| 7,612,472 | B2 * | 11/2009 | Mutabdzija ........... | H01M 10/48 307/150 |
| 8,089,248 | B2 * | 1/2012 | Tabatowski-Bush ................. | H01M 10/4207 320/116 |

(Continued)

*Primary Examiner* — Roy Y Yi
*Assistant Examiner* — Jeffrey Aiello
(74) *Attorney, Agent, or Firm* — Nixon Peabody LLP; Eduardo J. Quiñones; Zhou Lu (57) ABSTRACT

A rack server system and a control method thereof are provided. The rack server system establishes a communication link for communicating with a battery backup unit. The battery backup unit is connected to a power input port of the rack server system, and includes a number of battery modules connected with each other in parallel. The rack server system controls the battery backup unit to perform validity test on a first battery module during a first period and to perform validity test on a second battery module during a second period, wherein the first period and the second period are not overlapped with each other.

20 Claims, 5 Drawing Sheets

(56) References Cited

U.S. PATENT DOCUMENTS

| | | | |
|---|---|---|---|
| 8,525,519 B2* | 9/2013 | Johnson | G01R 31/3648 324/427 |
| 9,360,911 B2* | 6/2016 | Jau | G06F 1/30 |
| 2005/0149280 A1* | 7/2005 | Sharma | G01R 31/3631 702/63 |
| 2007/0136453 A1 | 6/2007 | Ewing et al. | |
| 2008/0164762 A1* | 7/2008 | Pecile | H02J 7/0047 307/66 |
| 2008/0303527 A1* | 12/2008 | Fechalos | G01R 31/3606 324/426 |
| 2010/0056228 A1 | 3/2010 | Brown et al. | |
| 2010/0259221 A1* | 10/2010 | Tabatowski-Bush | H01M 10/4207 320/134 |
| 2010/0295513 A1* | 11/2010 | McCollum | G06F 1/26 320/134 |
| 2011/0121645 A1* | 5/2011 | Zhang | H02J 7/0016 307/9.1 |
| 2011/0133559 A1* | 6/2011 | Yamashita | G06F 1/30 307/66 |
| 2011/0298626 A1* | 12/2011 | Fechalos | H01M 10/482 340/664 |
| 2012/0116590 A1 | 5/2012 | Florez-Larrahondo et al. | |
| 2012/0137148 A1* | 5/2012 | He | H04L 12/10 713/310 |
| 2012/0179399 A1* | 7/2012 | Yun | H01M 10/441 702/63 |
| 2012/0319657 A1* | 12/2012 | Ke | H02J 7/0021 320/134 |
| 2013/0141828 A1* | 6/2013 | Yamaguchi | H01M 10/44 361/86 |

\* cited by examiner

FIG. 4

RACK SERVER SYSTEM AND CONTROL METHOD THEREOF

This application is a continuation application of U.S. Non-Provisional patent application Ser. No. 13/409,256, filed on Mar. 1, 2012 and entitled "RACK SERVER SYSTEM AND CONTROL METHOD THEREOF", which claims priority to Taiwan Application No. 100126882, filed Jul. 28, 2011, the contents of which are herein incorporated by reference in their entirety.

TECHNICAL FIELD

The disclosure relates in general to a rack server system and a control method thereof, and more particularly to a rack server system which controls a battery backup unit via a communication interface to perform validity test and a control method thereof.

BACKGROUND

A battery backup unit may replace the uninterruptible power supply (UPS). Under the circumstances when abnormality (such as power off, power insufficient, power interference or surge) occurs to a main power supplied to a rack server system, the battery backup unit supplies power to the rack server system to maintain normal operation; and a power supply apparatus such as a power generator is activated to provide backup power. In general, the battery backup unit is used for maintaining necessary operations for critical commercial or precision apparatuses, such as rack server systems, switches, to prevent data loss lest the business might suffer from tremendous loss or other unexpected consequences.

Validity of the battery backup unit has much to do with system stability. If the battery backup unit fails due to aging or other factors, the battery backup unit may not maintain the normal operation of the rack server system when abnormality occurs to the main power supplied to the rack server system, and data may be lost. To assure the validity of the battery backup unit, validity test such as discharge test is performed on the battery backup unit periodically to obtain whether the battery has sufficient power.

However, if abnormity, such as power off, occurs to the main power supplied to the rack server system when the battery backup unit is in discharge test, power stored in the battery backup unit may be nearly used up and the battery backup unit may be unable to maintain the normal operation of the rack server system. Meanwhile, the rack server system may have stability problem which may lead to data loss. Therefore, how to reduce the risk of data loss of the rack server system has become a prominent task for the industries.

SUMMARY OF THE DISCLOSURE

The disclosure is directed to a rack server system and a control method thereof which reduce the risk of data loss of the rack server system when a battery backup unit is in validity test.

According to an example of the present disclosure, a control method applicable to a rack server system is provided. The rack server system establishes a communication link for communicating with a battery backup unit. The battery backup unit is connected to a power input port of the rack server system, and includes a number of battery modules connected with each other in parallel. The rack server system controls the battery backup unit to perform a validity test on a first battery module during a first period and to perform a validity test on a second battery module during a second period, wherein the first period and the second period are not overlapped with each other.

According to another example of the present disclosure, a rack server system is provided. The rack server system includes a power input port, a communication interface and a control unit. The power input port is connected to a battery backup unit. The battery backup unit includes a number of battery modules connected with each other in parallel. The communication interface establishes a communication link for communicating with the battery backup unit. The control unit is connected to the communication interface. The control unit controls the battery backup unit to perform a validity test on a first battery module during a first period and to perform a validity test on the validity of a second battery module during a second period, wherein the first period and the second period are not overlapped with each other.

It is to be understood that both the foregoing general description and the following detailed description are exemplary and explanatory only and are not restrictive of the disclosed embodiments, as claimed.

DETAILED DESCRIPTION OF THE DISCLOSURE

A rack server system and a control method thereof are disclosed in a number of embodiments below. In some embodiments, a battery backup unit includes a number of battery modules connected in parallel. The battery modules are controlled by a rack server system via a communication interface; and validity test such as discharge test is performed on the battery modules in time-sharing. In other words, when a part of the battery modules are under validity test, other part of the battery modules are not under validity test and are ready to provide power to the rack server system. Thus, the risk of data loss of the rack server system is reduced.

Figure 1:
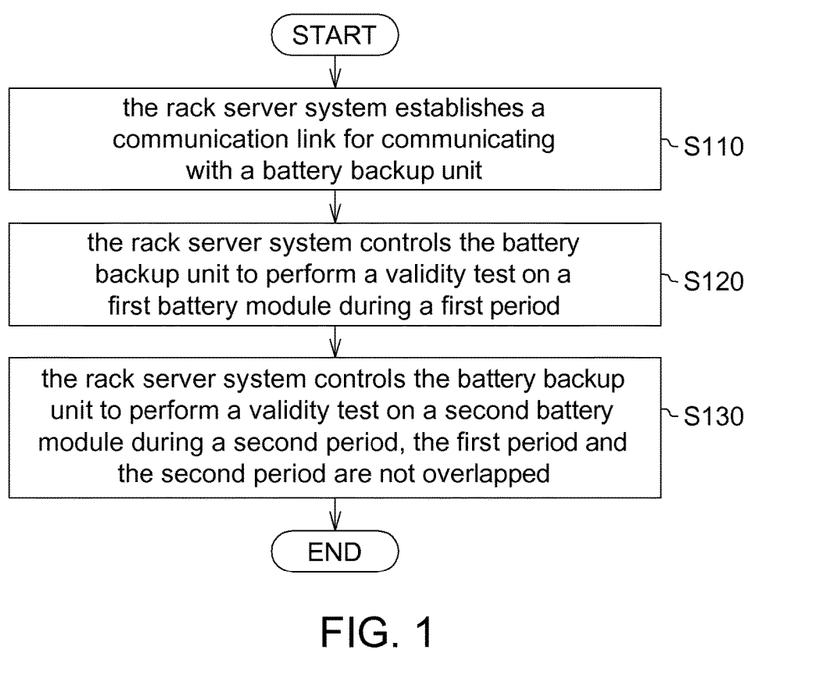
FIG. 1 shows a flowchart of a control method according to one embodiment of the disclosure.

Referring to FIG. 1, a flowchart of a control method according to one embodiment of the disclosure is shown. The control method is for use in the rack server system. At step S110, the rack server system establishes a communication link for communicating with a battery backup unit. The battery backup unit is connected to a power input port of the rack server system. The battery backup unit includes a number of battery modules connected in parallel. At step S120, the rack server system controls the battery backup unit to test validity of a first battery module of the battery backup unit during a first period. At step S130, the rack server system controls the battery backup unit to test validity of a second battery module of the battery backup unit during a second period. The first period and the second period are not overlapped with each other. The two non-overlapping periods refer that the two battery modules of the battery backup unit are under validity test in time-sharing to reduce the risk of data loss of the rack server system.

Figure 2:
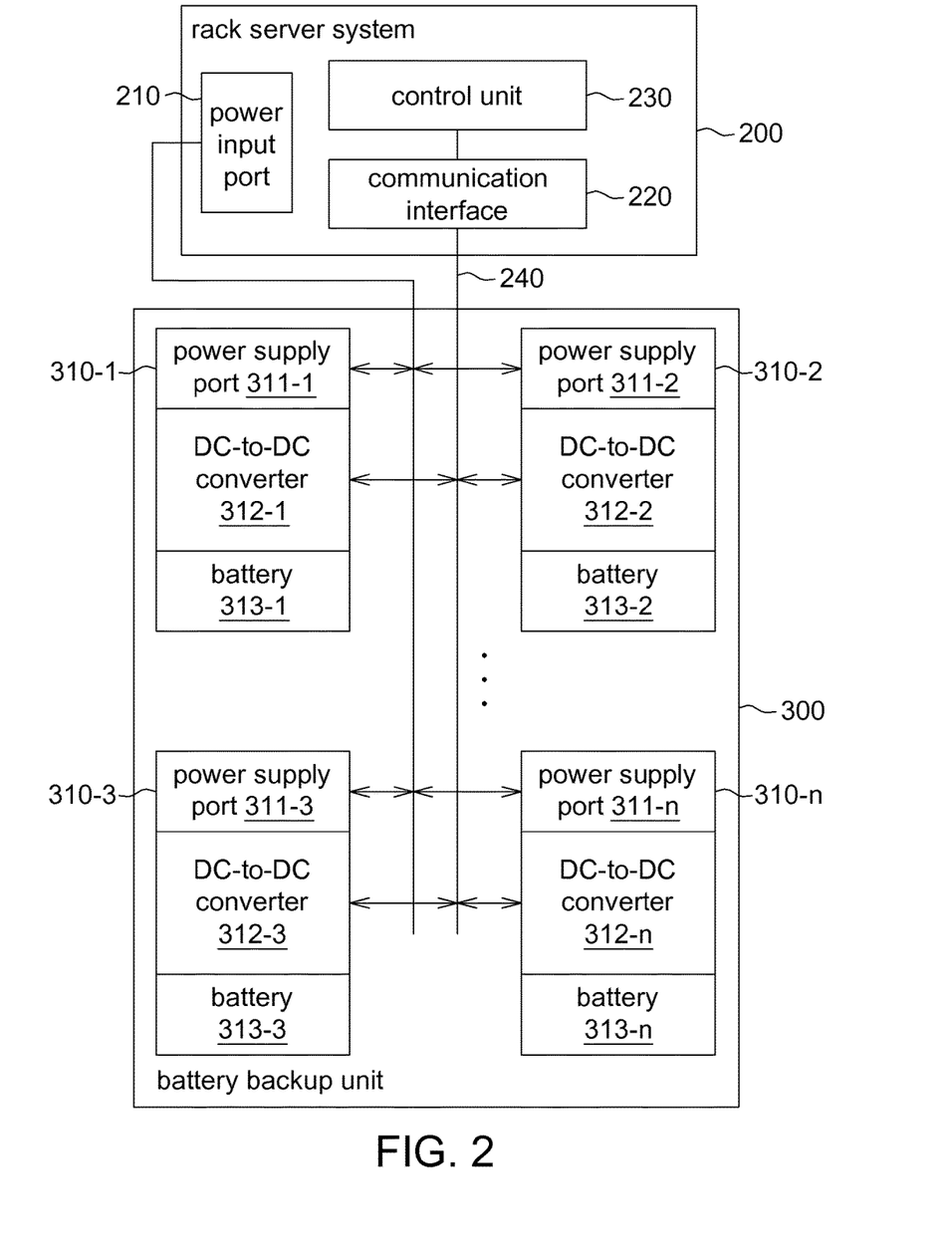
FIG. 2 shows a block diagram of an example of a rack server system and a battery backup unit according to one embodiment of the disclosure.

Referring to FIG. 2, a block diagram of an example of the rack server system and the battery backup unit according to one embodiment of the disclosure is shown. The rack server system 200 may be realized by such as but not limited to a cloud computing rack server system. The rack server system 200 such as includes a number of servers (not illustrated) inside a rack. The rack server system 200 at least includes a power input port 210, a communication interface 220, and a control unit 230. In FIG. 2, the rack server system 200 of the present example is illustrated as a basic model for convenience of elaborating the embodiments of the disclosure, and in fact, rack server system should include other circuits not illustrated here.

The power input port 210 is connected to a battery backup unit 300. For example, the power input port 210 may be realized by a DC power input port for receiving DC power. The power input port 210 may include two or more input ends for receiving DC power having different polarities or different levels such as receiving power from an AC/DC power supply or receiving power from the battery backup unit 300. When abnormality occurs to a main power supplied the rack server system 200, the power input port 210 feeds the power from the battery backup unit 300 to the system 200, such that the system 200 is powered for maintaining normal operations.

The communication interface 220 establishes a communication link for communicating with the battery backup unit 300. In some embodiments, the communication interface 220 is a wireless communication interface such as Bluetooth, wireless fidelity (Wi-Fi), or other wireless communication standards or wireless communication protocols. In some other embodiments, the communication interface 220 is such as a wire communication interface, which may be connected to the battery backup unit 300 via a communication bus 240 of the rack server system 200. The communication bus 240 is such as an RS232 bus, an I$^2$C bus, a controller area network (CAN) bus, or other bus.

The control unit 230 is connected to the communication interface 220. Via the communication interface 220, the control unit 230 controls the battery backup unit 300 to perform validity test on the battery backup unit 300. In the present embodiment of the disclosure, the battery backup unit 300 includes a number of battery modules 310-1~310-n connected in parallel as indicated in FIG. 2. The control unit 230 plans or arranges execution times and execution sequence of validity tests on the battery modules 310-1~310-n for reducing risk of data loss of the rack server system.

In some embodiments, the control unit 230 may control the battery backup unit 300 to test validity of the battery modules 310 one by one, sequentially or non-concurrently. For example, the control unit 230 may control the battery backup unit 300 so as to test validity of the first battery module 310-1 during a first period and to test validity of a second battery module 310-2 during a second period, wherein the first period and the second period are not overlapped with each other. The validity test periods on other battery modules 310-3~310-n may be arranged similarly. Thus, during any test period, the rack server system 200 may be powered by battery modules not under validity test, and the risk of data loss of the rack server system may thus be reduced.

In some other embodiments, the control unit 230 may control the battery backup unit 300 to test validity of a part of the battery modules (such as two or more battery modules) during a first period and test validity of another part of the battery modules (such as another two or more battery modules) during a second period. Thus, during any test period, the rack server system 200 may be powered by battery modules not under validity test, and risk of data loss of the rack server system can thus be reduced.

For the battery backup unit 300, each of the battery modules 310-1~310-n includes similar elements. Let the battery module 310-1 be taken for example. The battery module 310-1 includes a power supply port 311-1, a DC-to-DC converter 312-1, and a battery 313-1. The power supply port 311-1 is coupled to the power input port 210 of the rack server system 200. The DC-to-DC converter 312-1 is connected between the battery 313-1 and the power supply port 311-1 for converting a voltage of the battery 313-1 into a voltage for the rack server system 200. The battery 313-1 is such as a secondary battery or other type. In some implementation examples, the battery 313-1 is such as a lithium battery. In some other implementation examples, the battery 313-1 is such as a reusable battery, a rechargeable battery or a replaceable battery.

The arrangement of a number of battery modules increases the power supply stability of the battery backup unit 300. In other words, if one battery module fails, other battery modules of the battery backup unit 300 still provides power to the rack server system 200. Thus, stability of the rack server system 200 is kept so as to reduce risk of data loss of the rack server system.

Moreover, for the battery backup unit 300, via the validity test, the control unit 230 knows whether the battery backup unit 300 fails due to aging or other factors, so as to assure validity of the battery backup unit 300. In an implementation example, the validity test on the battery backup unit 300 is such as discharge test. During the discharge test, the battery backup unit 300 increases its output voltage so as to provide energy to the rack server system 200. In other implementation example, if the battery backup unit 300 uses lithium battery, then the validity test is a learning curve test which records the relationship between usage time and voltage. However, the disclosure is not limited to such exemplification, and the validity test on the battery backup unit 300 is based on the types of the battery modules or on user request.

Figure 3A:
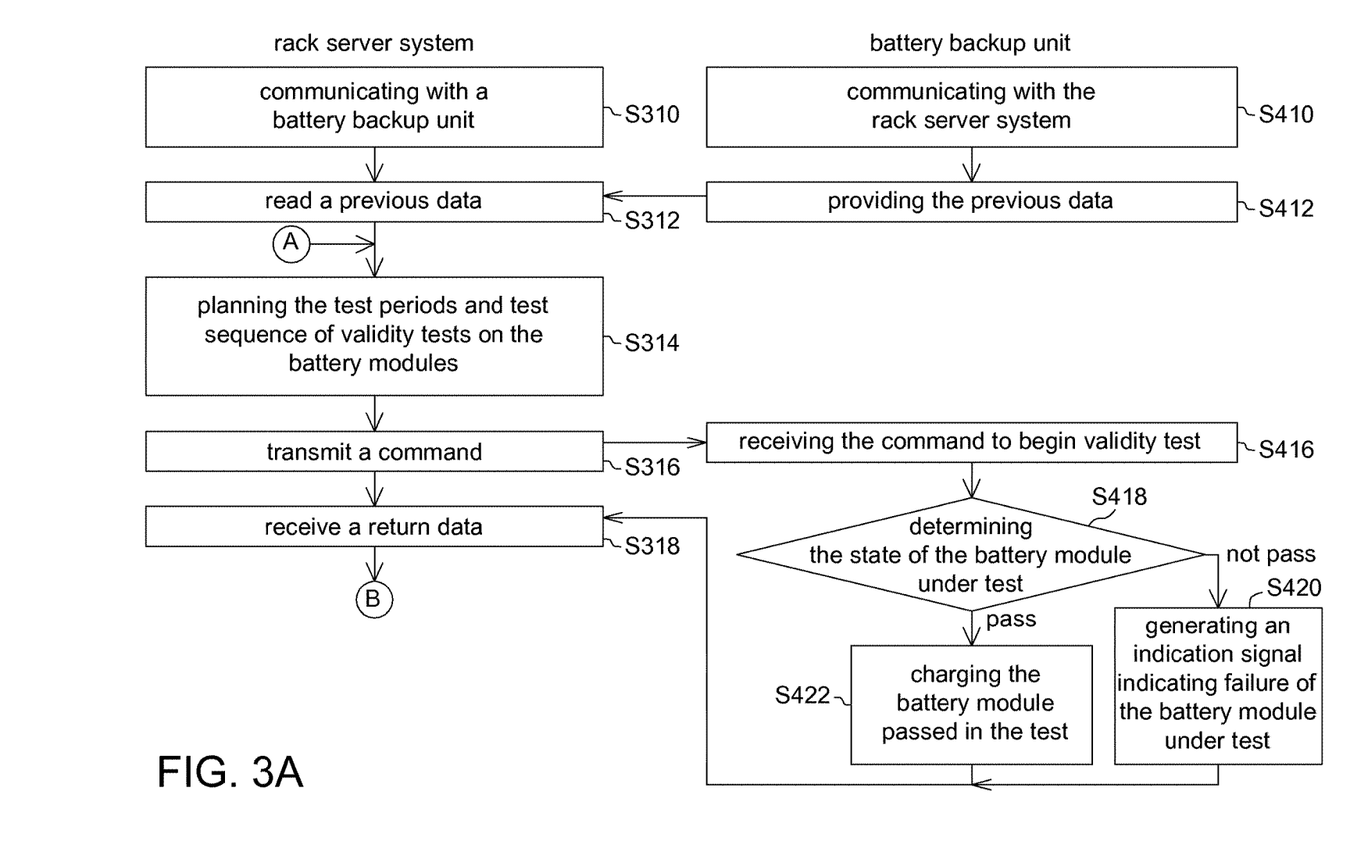
FIG. 3A and FIG. 3B show timing diagrams of an example of communication between the rack server system and the battery backup unit of FIG. 2.
Figure 3B:
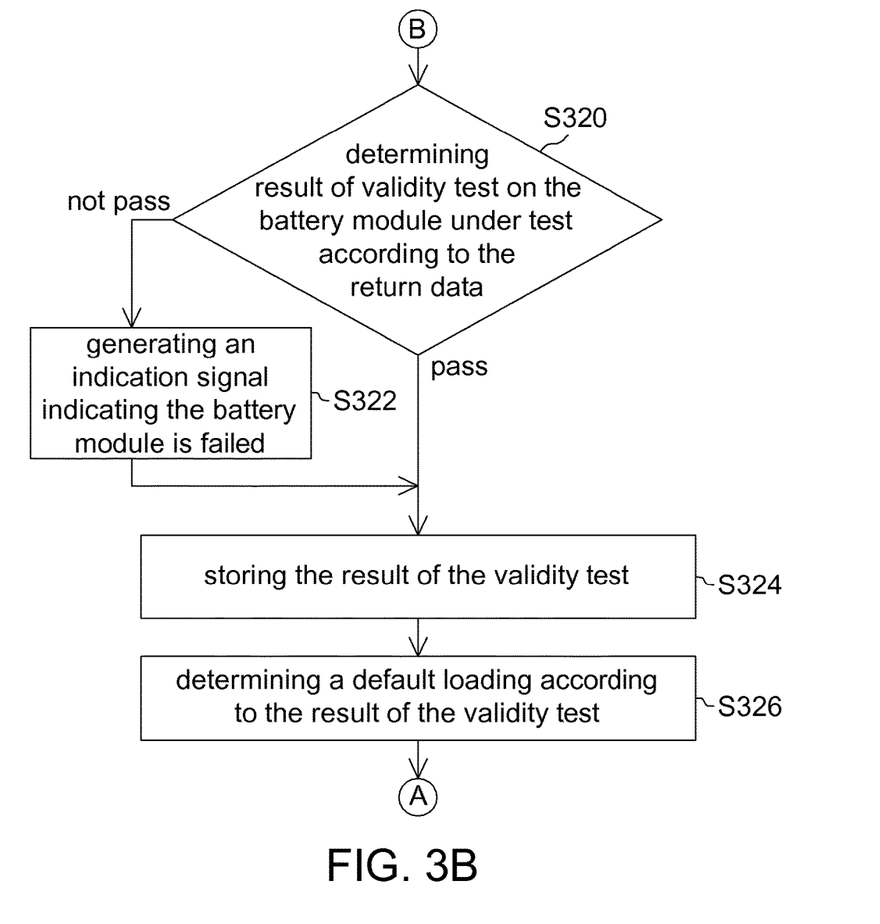

Referring to FIG. 3A and FIG. 3B, timing diagrams of an example of the communication between the rack server system and the battery backup unit of FIG. 2 are shown. The disclosure is further elaborated below in conjunction with FIG. 2 and FIGS. 3A and 3B.

At step S310, the rack server system 200 establishes a communication link for communicating with the battery backup unit 300. Correspondingly, in step S410, the battery backup unit 300 communicates with the rack server system 200.

In step S312, the rack server system 200 reads previous data to obtain result(s) of previous validity test(s) and execution time(s) on the battery backup unit 300. Correspondingly, in step S412, the battery backup unit 300 provides previous test data to the rack server system 200. Test data is stored in a memory of the battery backup unit 300, such as a non-volatile memory. Data read by the rack server system 200 are information such as the execution time and the result of a previous validity test on the battery modules 310-1~310-n, or other information such as lifespan, manufacturer, manufacture date, and electrical characteristics.

In step S314, the rack server system 200 plans or arranges the execution times and test sequence of validity tests on the battery modules 310-1~310-n. The rack server system 200 such as plans or arranges the execution times and sequence of validity tests on the battery modules 310-1~310-n according to the read data. For example, considering system stability, the execution times of validity tests on the battery modules 310-1~310-n are neither concurrent nor overlapped with each other. The execution sequences of validity test on the battery modules 310-1~310-n are such as determined according to previous execution times. For example, the earlier the previous test time on a battery module, the higher sequence priority of the validity test on the battery module. The execution time of validity tests on the battery modules 310-1~310-n are determined according to previous execution results of the battery modules 310-1~310-n. For example, the battery module(s) which was/were failed in the previous validity test may be not tested so as to reduce the total test time.

In step S316, the rack server system 200 sends a command to notify the battery backup unit 300 for a validity test. Correspondingly, in step S416, the battery backup unit 300 receives the command to begin validity test. For example, the battery backup unit 300 increases the output voltage to release energy.

In step S318, the rack server system 200 receives a return data indicating the test result. Correspondingly, in step S418, the battery backup unit 300 determines the state of the battery module(s) under test. If the test result indicates "pass", then the method proceeds to step S422, the battery backup unit 300 charges the battery module(s) passed in the test, and after charging finishes, the battery backup unit 300 transmits the return data and the method proceeds to step S318. If the test result indicates "fail", then the method proceeds to step S420, the battery backup unit 300 controls an indicator such as a light emitting diode (LED) to generate an indication signal such as a light signal indicating failure of the battery module(s) under test. Some embodiments may further include other steps for generating the return data indicating the test result or steps for storing the test result to a memory (not shown) of the battery backup unit 300.

In step S320, the rack server system 200 determines the result of validity test on the battery module(s) according to the return data. If the test result indicates "fail", then the method proceeds to step S322. If the test result indicates "pass", then the method proceeds to step S324.

In step S322, the rack server system 200 generates the indication signal, such as a light signal, an audio signal, or a signal for displaying a message on a screen, to notify or remind the user to replace the battery module. Then, the method proceeds to step S324.

In step S324, the rack server system 200 stores the results of validity test. Via the communication interface 220, the test result is transmitted to the control unit 230 and may be further stored in a memory (not shown) of the control unit 230 or other memory not shown.

In step S326, the rack server system 200 determines a default loading according to the results of validity tests on the battery modules 310-1~310-n. The default loading determines efficiency of the rack server system 200 when abnormality occurs to the main power supplied to the rack server system 200. The default loading such as determines the loading of the rack server system when abnormality occurs to the main power.

In some embodiments, the default loading determines the number of normal operating servers of the rack server system when abnormality occurs to the main power. For example, under full-loading, the rack server system 200 may activate all servers so as to operate at high efficiency and at high power consumption. Under half-loading, the rack server system 200 activates half of the servers and shut down another half of the servers safely, and both efficiency and power consumption are reduced.

In some embodiments, the default loading determines operation frequency of a processor of each server of the rack server system when abnormality occurs to the main power. For example, under full-loading, the processor of each server of the rack server system 200 operates at highest operation frequency, high efficiency but high power consumption. Under half-loading, the operation frequency of the processor of each server of the rack server system 200 is half, and efficiency and power consumption are reduced.

The above default loading for determining the number of the active servers and/or for determining the operation frequency of the processor of the server is for exemplification purpose not for limiting the disclosure. The default loading may also be other parameters relating to the efficiency, loading, or power consumption of the rack server system when abnormality occurs to the main power.

In some embodiments, when a battery module is failed in the validity test, the rack server system 200 may reduce the default loading. The default loading is such as reduced according to the number of the failed battery modules. Suppose 10 battery modules are used, and the initial default loading is full-loading. When one battery module fails, the default loading may be reduced by 1 tenth as 9-tenth loading. When a half of the battery modules fails, the default loading may be reduced by 5 tenths as half-loading. Thus, when abnormality occurs to the main power of the rack server system 200, the rack server system 200 avoids operating at high efficiency and/or high power consumption. Thus, the stability of the rack server system is kept so as to reduce the risk of data loss of the rack server system.

Figure 4:
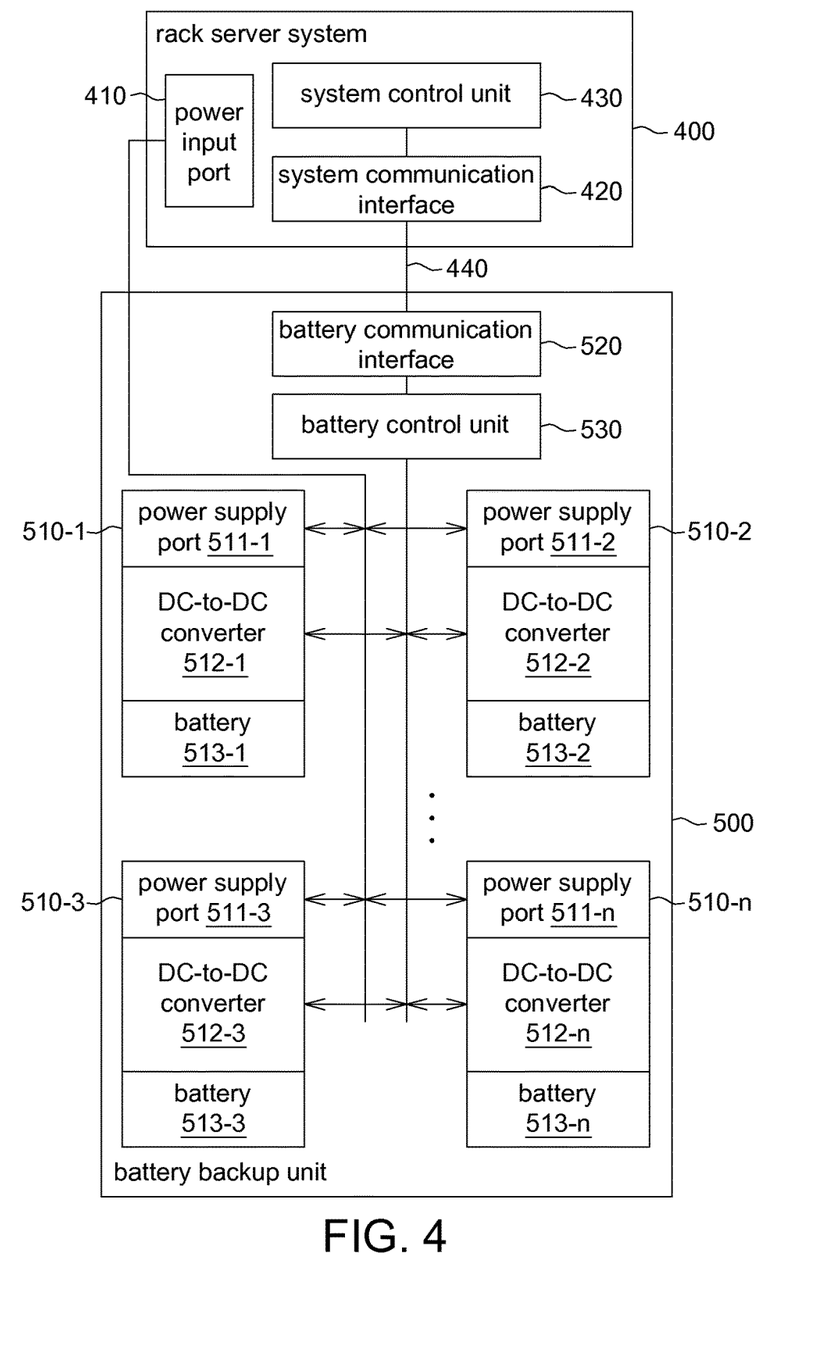
FIG. 4 shows a block diagram of another example of a rack server system and a battery backup unit according to one embodiment of the disclosure.

Referring to FIG. 4, a block diagram of another example of a rack server system and a battery backup unit according to one embodiment of the disclosure is shown.

In the present example, the rack server system 400 includes a power input port 410, a system communication interface 420, and a system control unit 430. The operations of the rack server system 400 are similar to that of the rack server system 200 of FIG. 2, and the similarities are not repeated here.

The battery backup unit 500 includes a number of battery modules 510-1~510-n connected in parallel, and further includes a battery communication interface 520 and a battery control unit 530. The battery control unit 530 and the rack server system 400 communicate with each other and may implement the above control method.

The battery control unit 530 may execute a part of operations of the system control unit 430. For example, the battery control unit 530 receives a notification from the system control unit 430 and controls the battery modules 510-1~510-n to perform validity test in time-sharing. In another example as indicated in step S314, the battery control unit 530 may plan and arrange the execution time and sequence of validity test.

No matter the rack server system controls the battery backup unit to perform validity test or the rack server system notifies the control unit of the battery backup unit to perform validity test, those are possible embodiments of the disclosure as long as battery modules of the battery backup unit are tested in time-sharing.

According to the rack server system and the control method thereof of the present embodiment of the disclosure, the battery backup unit includes a number of battery modules connected with each other in parallel and the battery modules are controlled by the rack server system via the communication interface to be tested such as a discharge test in a time-sharing manner, so as to reduce the risk of data loss of the rack server system.

In some embodiments, with the configuration of the battery backup unit (which is modularized) and the communication interface, the rack server system notifies the battery modules to be under test (i.e. system control). The advantage of system control is that all loading conditions are taken into consideration to avoid interrupt of power supply during test or due to failure of the battery module. In cooperation with the battery backup unit which is modularized, the system controls the battery modules under validity test at different periods (i.e. in time-sharing), so as to keep system stability.

In some other embodiments, the power consumption of the rack server system when abnormality occurs to the main power may be determined according to the results of validity tests on the battery modules, so as to avoid the rack server system operating at high efficiency and high power consumption. Thus, the risk of data loss of the rack server system may be further reduced.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A battery backup control system, comprising:
    a battery backup unit providing backup battery support for a server system, and including a plurality of battery modules connected in parallel;
    a controller configured to:
        receive results of previous validity tests on the plurality of battery modules;
        determine that a first previous validity test of a first set battery modules of the plurality of battery modules is passed;
        perform a first validity test of the first set battery modules during a first period of time;
        determine that a second previous validity test of a second set battery modules of the plurality of battery modules is failed; and
        skip a second validity test of the second set of battery modules during a second period of time;
    wherein the first and second periods of time do not overlap and are configured in a time-sharing fashion such that the battery backup unit remains ready to provide the backup battery support to the server system.

2. The control system of claim 1, wherein the first and second sets of battery modules each include at least one battery module.

3. The control system of claim 1, wherein the first and second sets of battery modules do not overlap.

4. The control system of claim 2, wherein at least one of the first set of battery modules or the second set of battery modules includes at least two battery modules.

5. The control system of claim 1, wherein the controller is connected to the battery backup unit, and controls the battery backup unit to perform the first and second validity tests.

6. The control system of claim 1, wherein the first and second validity tests are discharge tests.

7. The control system of claim 1, wherein each battery module comprise: a power supply port;
    a battery; and
    a DC-to-DC converter connected between the battery and the power supply port.

8. The control system of claim 1, wherein the load is a server rack system.

9. The control system of claim 8, wherein the controller is a part of the server rack system, and wherein the control system further comprises a communication interface configured to provide a communication pathway between the controller and the battery backup unit.

10. A battery backup control system, comprising:
    a server rack system;
    a battery backup unit configured to provide backup battery support for the server rack system, and including a plurality of battery modules connected in parallel;
    a controller configured to:
        receive results of previous validity tests on the plurality of battery modules;
        determine that a first previous validity test of a first set battery modules of the plurality of battery modules is passed;
        perform a first validity test of the first set battery modules during a first period of time;
        determine that a second previous validity test of a second set battery modules of the plurality of battery modules is failed; and
        skip a second validity test of the second set of battery modules during a second period of time; and
    a communication interface configured to provide a communication pathway between the controller and the battery backup unit;
    wherein the first and second periods of time do not overlap and are configured in a time-sharing fashion such that the battery backup unit remains ready to provide the backup battery support to the server rack system.

11. The control system of claim 10, wherein the first and second sets of battery modules each include at least one battery module.

12. The control system of claim 10, wherein the first and second sets of battery modules do not overlap.

13. The control system of claim 11, wherein the first and/or the second sets of battery modules includes at least two battery modules.

14. The control system of claim 10, wherein the first and second validity tests are discharge tests.

15. The control system of claim 10, wherein each battery module comprises:
    a power supply port;
    a battery; and
    a DC-to-DC converter connected between the battery and the power supply port.

16. A method for controlling a battery backup control system, comprising:
    providing backup battery support for a server system through a battery backup unit including a plurality of battery modules connected in parallel;
    receiving results of previous validity tests on the plurality of battery modules;
    determining that a first previous validity test of a first set battery modules of the plurality of battery modules is passed;

performing a first validity test of the first set battery modules during a first period of time;

determining that a second previous validity test of a second set battery modules of the plurality of battery modules is failed; and skipping a second validity test of the second set of battery modules during a second period of time, wherein the first and second periods of time do not overlap and are configured in a time-sharing fashion such that the battery backup unit remains ready to provide the backup battery support to the server system.

17. The method of claim 16, wherein the first and second performing each comprises a test on at least one battery.

18. The method of claim 16, wherein the first and second sets of battery modules do not overlap.

19. The method of claim 16, wherein the first and/or the second performing comprises a test on at least two battery modules.

20. The method of claim 16, wherein the first and second validity tests are discharge tests.

* * * * *